(12) United States Patent
Miyata

(10) Patent No.: US 11,575,247 B2
(45) Date of Patent: Feb. 7, 2023

(54) LIGHT EMITTING DEVICE AND PROJECTOR

(71) Applicant: Seiko Epson Corporation, Tokyo (JP)

(72) Inventor: Takashi Miyata, Shiojiri (JP)

(73) Assignee: SEIKO EPSON CORPORATION

( * ) Notice: Subject to any disclaimer, the term of this patent is extended or adjusted under 35 U.S.C. 154(b) by 119 days.

(21) Appl. No.: 16/912,856

(22) Filed: Jun. 26, 2020

(65) Prior Publication Data

US 2020/0412100 A1 Dec. 31, 2020

(30) Foreign Application Priority Data

Jun. 28, 2019 (JP) .............................. JP2019-121001

(51) Int. Cl.

| | |
|---|---|
| *H01S 5/34* | (2006.01) |
| *H01S 5/343* | (2006.01) |
| *H01S 5/042* | (2006.01) |
| *H01S 5/185* | (2021.01) |
| *H01S 5/11* | (2021.01) |
| *G03B 21/20* | (2006.01) |
| *H01S 5/0234* | (2021.01) |

(52) U.S. Cl.
CPC .......... *H01S 5/341* (2013.01); *H01S 5/04253* (2019.08); *H01S 5/04256* (2019.08); *H01S 5/11* (2021.01); *H01S 5/185* (2021.01); *H01S 5/34333* (2013.01); *G03B 21/2033* (2013.01); *H01S 5/0234* (2021.01); *H01S 5/04254* (2019.08); *H01S 5/04257* (2019.08)

(58) Field of Classification Search
CPC ............ H01S 5/341–3412; H01S 5/11; H01S 5/185–187; H01S 5/04254; H01S 5/04256–04257; H01S 2301/176; H01S 5/18–187
See application file for complete search history.

(56) References Cited

U.S. PATENT DOCUMENTS

| | | | | | |
|---|---|---|---|---|---|
| 5,332,910 | A | * | 7/1994 | Haraguchi | ............ H01S 5/1228 257/13 |
| 7,435,996 | B2 | * | 10/2008 | Jin | ......................... B82Y 20/00 257/88 |
| 7,825,032 | B2 | * | 11/2010 | Bakkers | ............ H01L 29/66439 438/707 |
| 7,995,193 | B2 | * | 8/2011 | Kuwata | .................. G01S 7/4916 356/27 |
| 8,168,996 | B2 | * | 5/2012 | Inoue | ...................... H01L 33/38 257/99 |
| 8,183,576 | B2 | * | 5/2012 | Min | ......................... H01L 33/18 257/79 |

(Continued)

FOREIGN PATENT DOCUMENTS

| | | | | |
|---|---|---|---|---|
| CN | 101273467 A | * | 9/2008 | ........... H01L 33/007 |
| CN | 101305478 A | * | 11/2008 | ............. H01L 33/20 |

(Continued)

*Primary Examiner* — Joshua King
(74) *Attorney, Agent, or Firm* — Harness, Dickey & Pierce, P.L.C.

(57) ABSTRACT

A light emitting device includes a substrate, a laminated structure provided to the substrate, and including a plurality of columnar parts, and a covering part configured to cover the laminated structure, wherein the columnar parts have a light emitting layer, and the covering part is provided with a through hole penetrating the covering part.

8 Claims, 7 Drawing Sheets

(56) References Cited

U.S. PATENT DOCUMENTS

| | | | |
|---|---|---|---|
| 9,559,495 B1* | 1/2017 | Koenck | H01L 27/14625 |
| 10,340,659 B1* | 7/2019 | Lin | H01S 5/11 |
| 10,908,487 B1* | 2/2021 | Itoh | H04N 9/3155 |
| 2004/0144985 A1* | 7/2004 | Zhang | H01L 21/02488 |
| | | | 257/79 |
| 2004/0157354 A1* | 8/2004 | Kuriyama | G02B 6/1225 |
| | | | 438/45 |
| 2004/0253758 A1 | 12/2004 | Jung et al. | |
| 2004/0259331 A1* | 12/2004 | Ogihara | H01L 21/2007 |
| | | | 438/462 |
| 2005/0194598 A1* | 9/2005 | Kim | H01L 33/08 |
| | | | 257/79 |
| 2006/0098705 A1* | 5/2006 | Wang | B82Y 20/00 |
| | | | 372/50.124 |
| 2007/0014324 A1* | 1/2007 | Maeda | H01S 5/18391 |
| | | | 372/46.01 |
| 2007/0248132 A1* | 10/2007 | Kikuchi | H01S 5/021 |
| | | | 372/44.01 |
| 2008/0232414 A1* | 9/2008 | Masui | H01S 5/18311 |
| | | | 372/44.01 |
| 2008/0279241 A1* | 11/2008 | Oki | H01S 5/34313 |
| | | | 372/45.01 |
| 2008/0298418 A1* | 12/2008 | Uchida | H01S 5/04253 |
| | | | 372/50.124 |
| 2010/0103972 A1* | 4/2010 | Saito | H01S 5/18 |
| | | | 372/50.1 |
| 2010/0288341 A1* | 11/2010 | Kim | H01L 31/0352 |
| | | | 136/252 |
| 2012/0164767 A1* | 6/2012 | Gasse | H01L 27/153 |
| | | | 438/27 |
| 2013/0092899 A1* | 4/2013 | Svensson | H01L 29/0676 |
| | | | 257/13 |
| 2013/0188659 A1* | 7/2013 | Kondo | B82Y 20/00 |
| | | | 372/24 |
| 2014/0048838 A1* | 2/2014 | Yang | H01L 27/156 |
| | | | 257/99 |
| 2015/0221842 A1* | 8/2015 | Mima | H01L 33/52 |
| | | | 257/99 |
| 2015/0280062 A1* | 10/2015 | Yoo | H01L 33/145 |
| | | | 257/13 |
| 2015/0346522 A1 | 12/2015 | Hilarius et al. | |
| 2016/0093665 A1* | 3/2016 | Schubert | H01L 33/0062 |
| | | | 257/13 |
| 2016/0118774 A1* | 4/2016 | Skiba-Szymanska | H01S 5/3412 |
| | | | 372/45.01 |
| 2016/0336487 A1* | 11/2016 | Wang | H01L 33/507 |
| 2017/0117438 A1* | 4/2017 | Shur | H01L 31/035236 |
| 2017/0256914 A1* | 9/2017 | Hsu | H01S 5/04254 |
| 2017/0294762 A1* | 10/2017 | Kim | H01S 5/021 |
| 2018/0254611 A1* | 9/2018 | Mayer | H01S 5/026 |
| 2018/0366907 A1* | 12/2018 | Joseph | H01S 5/18308 |
| 2019/0252855 A1* | 8/2019 | Lu | H01S 5/3215 |
| 2019/0267775 A1* | 8/2019 | Noda | H01S 5/3063 |
| 2020/0373731 A1 | 11/2020 | Noda | |
| 2020/0412099 A1* | 12/2020 | Miyata | H01S 5/18347 |

FOREIGN PATENT DOCUMENTS

| | | | | |
|---|---|---|---|---|
| CN | 103988379 A | * | 8/2014 | H01S 5/04254 |
| CN | 105574756 A | * | 5/2016 | |
| CN | 108461588 A | * | 8/2018 | |
| CN | 110112172 A | * | 8/2019 | |
| JP | 2004193527 A | * | 7/2004 | B82Y 20/00 |
| JP | 2004200210 A | * | 7/2004 | H01S 5/18311 |
| JP | 2005-005266 A | | 1/2005 | |
| JP | 2005353828 A | * | 12/2005 | |
| JP | 2009076896 A | * | 4/2009 | |
| JP | 2009105182 A | * | 5/2009 | |
| JP | 2009-140976 A | | 6/2009 | |
| JP | 2009140976 A | * | 6/2009 | |
| JP | 2015-522837 A | | 8/2015 | |
| JP | 2019-029513 A | | 2/2019 | |
| JP | 2019-029522 A | | 2/2019 | |
| JP | WO2018062252 A1 | * | 6/2019 | H01L 33/24 |
| KR | 20140125521 A | * | 10/2014 | H01L 33/382 |
| WO | WO-2010087231 A1 | * | 8/2010 | H01S 5/187 |
| WO | WO-2012091275 A1 | * | 7/2012 | H01L 33/08 |
| WO | WO-2018181204 A1 | * | 10/2018 | H01S 5/04254 |
| WO | WO-2019026692 A1 | * | 2/2019 | H01S 5/026 |

* cited by examiner

LIGHT EMITTING DEVICE AND PROJECTOR

The present application is based on, and claims priority from JP Application Serial Number 2019-121001, filed Jun. 28, 2019, the disclosure of which is hereby incorporated by reference herein in its entirety.

BACKGROUND

1. Technical Field

The present disclosure relates to a light emitting device and a projector.

2. Related Art

Semiconductor lasers are promising as high-luminance next-generation light sources. In particular, the semiconductor laser having a nano-structure called a nano-column, a nano-wire, a nano-rod, a nano-pillar, or the like is expected to realize a light emitting device capable of obtaining narrow radiation angle and high power light emission due to an effect of a photonic crystal.

In JP-A-2009-140976 (Document 1), there is disclosed a semiconductor light emitting element having a plurality of nano-columns each having a first conductive type semiconductor layer, a light emitting layer, and a second conductive type semiconductor layer stacked in this order on a substrate forming one electrode, and having the other electrode formed on the second conductive type semiconductor layer. In the semiconductor light emitting element in Document 1, the substrate has a recessed part defining a formation area of the nano-columns, and a first insulating film is formed on an inner circumferential surface of the recessed part. The plurality of nano-columns formed in the recessed part is grown so that the respective second conductivity type semiconductor layers increase in diameter to be integrated with each other, and at the same time, an outer circumferential edge part of the second conductivity type semiconductor layers thus integrated adheres to the first insulating film on the inner circumferential surface of the recessed part, and thus, the inside of the recessed part is airtightly sealed. Therefore, it is possible to prevent the degradation of the efficiency due to the fact that a foreign matter is attached to the surface of the nano-columns to cause a leakage current to flow.

However, in the light emitting element disclosed in Document 1, a gas used in the manufacturing process and remaining between the nano-columns, a gas generated from a material forming the light emitting element, and so on remain in the recessed part sealed airtightly, and cause a change in volume or a change in state in some cases due to the heat generated in the manufacturing process or the heat generated when the light emitting element operates. Thus, for example, there is a possibility that the electrode is separated due to the expansion of the gas in the recessed part sealed airtightly, or there is a possibility that the element characteristic deteriorates due to the contamination of the surface of the nano-column.

SUMMARY

A light emitting device according to an aspect of the present disclosure includes a substrate, a laminated structure provided to the substrate, and including a plurality of columnar parts, and a covering part configured to cover the laminated structure, wherein the columnar parts have a light emitting layer, and the covering part is provided with a through hole penetrating the covering part.

In the light emitting device according to the above aspect, the covering part may include an electrode electrically coupled to the columnar parts, the electrode may be disposed at an opposite side to the substrate of the laminated structure, and the through hole may be provided to the electrode.

In the light emitting device according to the above aspect, a diametrical size of the through hole may be smaller than a diametrical size of the columnar part.

In the light emitting device according to the above aspect, at least a part of the through hole may fail to overlap the columnar parts in a plan view viewed from a stacking direction of the laminated structure.

In the light emitting device according to the above aspect, the through hole may have a longitudinal direction and a short-side direction in a plan view viewed from a stacking direction of the laminated structure, and a length in the short-side direction of the through hole may be shorter than a diametrical size of the columnar part.

In the light emitting device according to the above aspect, a length in the longitudinal direction of the through hole may be longer than the diametrical size of the columnar part.

In the light emitting device according to the above aspect, the covering part may include an electrode electrically coupled to the columnar parts, and an insulating layer, the electrode may be disposed at an opposite side to the substrate of the laminated structure, and the through hole may be provided to the insulating layer.

In the light emitting device according to the above aspect, the insulating layer may have an opening part, the electrode may be disposed in the opening part, and the through hole may be disposed outside an outer edge of the electrode in a plan view viewed from a stacking direction of the laminated structure.

In the light emitting device according to the above aspect, a diametrical size of the through hole may be smaller than a diametrical size of the columnar part.

In the light emitting device according to the above aspect, the through hole may penetrate the insulating layer in a direction crossing the stacking direction of the laminated structure.

A projector according to another aspect of the present disclosure includes the light emitting device according to one of the above aspects.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

Figure 1:
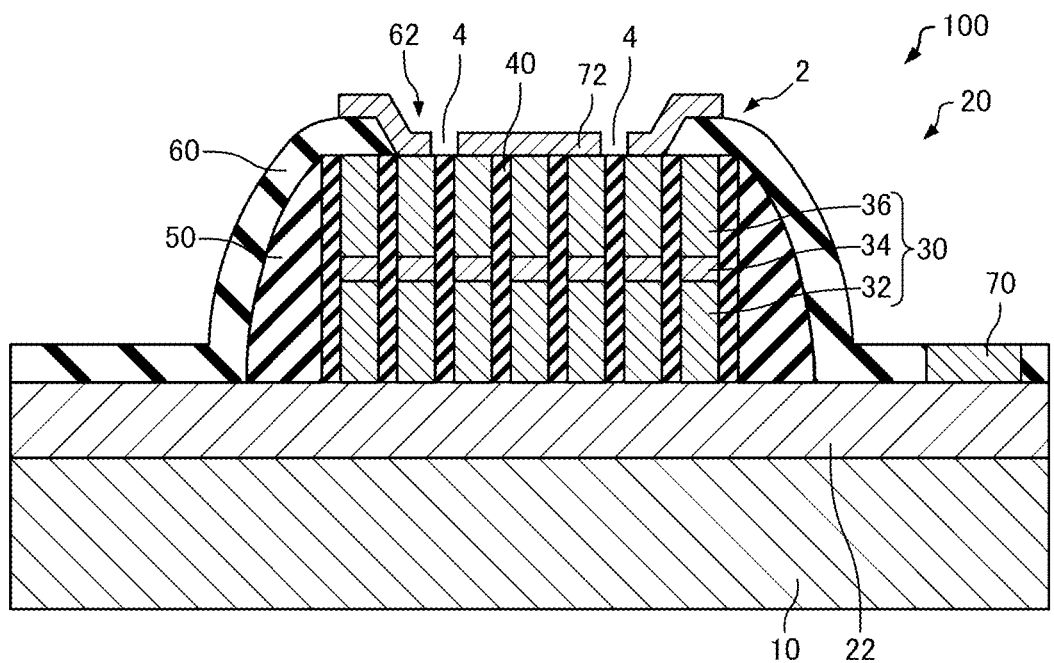
FIG. 1 is a cross-sectional view schematically showing a light emitting device according to a first embodiment.
Figure 2:
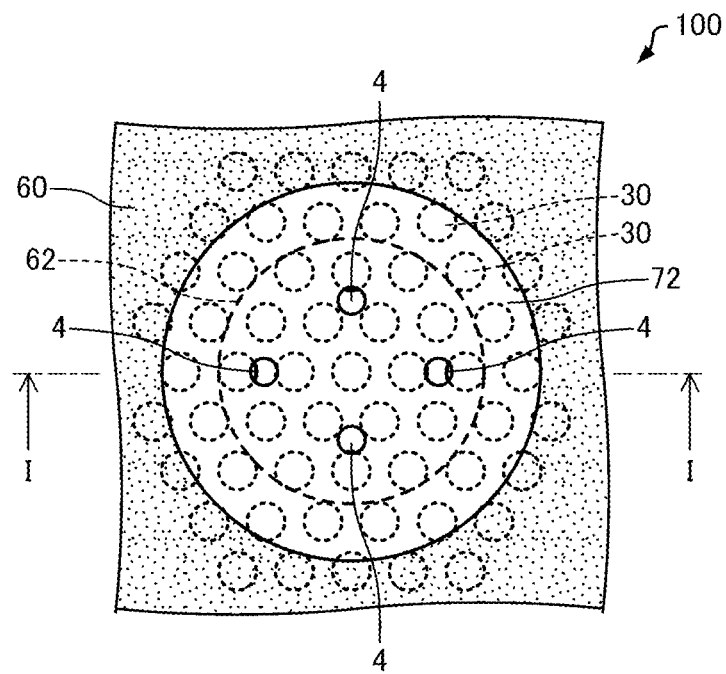
FIG. 2 is a plan view schematically showing the light emitting device according to the first embodiment.

Firstly, a light emitting device according to a first embodiment will be described with reference to the drawings. FIG. 1 is a cross-sectional view schematically showing a light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

As shown in FIG. 1 and FIG. 2, the light emitting device 100 has a substrate 10, a laminated structure 20, a sidewall 50, an insulating layer 60, a first electrode 70, and a second electrode 72.

The substrate 10 has, for example, a plate-like shape. The substrate 10 is, for example, an Si substrate, a GaN substrate, a sapphire substrate, or a glass substrate.

The laminated structure 20 is provided to the substrate 10. The laminated structure 20 is disposed on the substrate 10. The laminated structure 20 has, for example, a buffer layer 22, columnar parts 30, and a light propagation layer 40.

It should be noted that in the present specification, when taking a light emitting layer 34 as a reference in the stacking direction of the laminated structure 20 (hereinafter also referred to simply as a "stacking direction"), the description will be presented assuming a direction from the light emitting layer 34 toward the second semiconductor layer 36 as an "upward direction," and a direction from the light emitting layer 34 toward a first semiconductor layer 32 as a "downward direction." Further, the "stacking direction of the laminated structure" denotes a stacking direction of the first semiconductor layer 32 and the light emitting layer 34.

The buffer layer 22 is disposed on the substrate 10. The buffer layer 22 is, for example, an Si-doped n-type GaN layer.

The columnar parts 30 are disposed on the buffer layer 22. The columnar parts 30 each have a columnar shape protruding upward from the buffer layer 22. The planar shape of the columnar part 30 is, for example, a polygonal shape or a circle. In the example shown in FIG. 2, the planar shape of the columnar part 30 is a circle. The diametrical size of the columnar part 30 is in a nanometer-order range, and is, for example, no smaller than 10 nm and no larger than 500 nm. The columnar part 30 is also referred to as, for example, a nano-column, a nano-wire, a nano-rod, or a nano-pillar.

It should be noted that when the planar shape of the columnar part 30 is a circle, the "diametrical size of the columnar part" denotes the diameter of the circle, and when the planar shape of the columnar part 30 is not a circular shape, the "diametrical size of the columnar part" denotes the diameter of the minimum enclosing circle. For example, when the planar shape of the columnar part 30 is a polygonal shape, the diametrical size of the columnar part 30 is the diameter of the minimum circle including the polygonal shape inside, and when the planar shape of the columnar part 30 is an ellipse, the diametrical size of the columnar part 30 is the diameter of the minimum circle including the ellipse inside. Further, when the planar shape of the columnar part 30 is a circle, the "center of the columnar part 30" denotes the center of the circle, and when the planar shape of the columnar part 30 is not a circular shape, the "center of the columnar part 30" denotes the center of the minimum enclosing circle. For example, when the planar shape of the columnar part 30 is a polygonal shape, the center of the columnar part 30 is the center of the minimum circle including the polygonal shape inside, and when the planar shape of the columnar part 30 is an ellipse, the center of the columnar part 30 is the center of the minimum circle including the ellipse inside.

The number of the columnar parts 30 disposed is more than one. An interval between the columnar parts 30 adjacent to each other is, for example, no smaller than 1 nm and no larger than 500 nm. The plurality of columnar parts 30 is arranged at a predetermined pitch in a predetermined direction in a plan view viewed from the stacking direction (hereinafter also referred simply to "in the plan view"). The plurality of columnar parts 30 is disposed so as to form, for example, a triangular grid or a quadrangular grid. The plurality of columnar parts 30 can develop an effect of a photonic crystal. The columnar parts 30 each have the first semiconductor layer 32, the light emitting layer 34, and a second semiconductor layer 36. Here, the pitch of the columnar parts 30 is a distance between the centers of the columnar parts 30 adjacent to each other along the predetermined direction.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layers 36. The light emitting layer 34 emits light in response to injection of an electrical current. The light emitting layer 34 has a multiple quantum well structure obtained by stacking quantum well structures each constituted by, for example, an i-type GaN layer doped with no impurity and an i-type InGaN layer.

The second semiconductor layer 36 is disposed on the light emitting layer 34. The second semiconductor layer 36 is a layer different in conductivity type from the first semiconductor layer 32. The second semiconductor layer 36 is a p-type semiconductor layer. The second semiconductor layer 36 is, for example, an Mg-doped p-type GaN layer. The first semiconductor layer 32 and the second semiconductor layer 36 are cladding layers having a function of confining the light in the light emitting layer 34.

The light propagation layer 40 is disposed between the columnar parts 30 adjacent to each other. The light propagation layer 40 is disposed on the buffer layer 22. The light propagation layer 40 surrounds the columnar parts 30 in the plan view. The refractive index of the light propagation layer 40 is lower than, for example, the refractive index of the light emitting layer 34. The light propagation layer 40 is, for example, a silicon oxide layer, an aluminum oxide layer, or a titanium oxide layer. The light generated in the light emitting layer 34 can pass through the light propagation layer 40 to propagate in a direction perpendicular to the stacking direction. It should be noted that an air gap can be disposed between the columnar parts 30 adjacent to each other although not shown in the drawings.

The sidewall 50 is disposed so as to surround an area where the plurality of columnar parts 30 and the light propagation layer 40 are formed. The sidewall 50 is disposed on, for example, a side wall of the columnar part 30 or a side wall of the light propagation layer 40. In the illustrated example, the sidewall 50 is disposed on the side wall of the light propagation layer 40. The sidewall 50 is formed of an insulating member such as silicon oxide or silicon nitride.

The insulating layer 60 is disposed on the laminated structure 20. The insulating layer 20 is disposed on the buffer layer 22, the sidewall 50, the light propagation layer 40, and the plurality of columnar parts 30. The insulating layer 60 covers the plurality of columnar parts 30, the light propagation layer 40, and the sidewall 50. The insulating layer 60 has an opening part 62. The opening part 62 overlaps the plurality of columnar parts 30 and the light propagation layer 40 in the plan view. In the opening part 62, there is disposed the second electrode 72. The insulating layer 60 is, for example, an organic film made of polyimide or the like, or a silicon oxide layer.

The first electrode 70 is disposed on the buffer layer 22. It is also possible for the buffer layer 22 to have ohmic contact with the first electrode 70. The first electrode 70 is electrically coupled to the first semiconductor layer 32. In the illustrated example, the first electrode 70 is electrically coupled to the first semiconductor layer 32 via the buffer layer 22. The first electrode 70 is one of the electrodes for injecting the electrical current into the light emitting layer 34. As the first electrode 70, there is used, for example, what is obtained by stacking a Ti layer, an Al layer, and an Au layer in this order from the buffer layer 22 side.

The second electrode 72 is disposed on the opposite side to the substrate 10 of the laminated structure 20. The second electrode 72 is disposed in the opening part 62 of the insulating layer 60. The second electrode 72 is disposed so as to close the opening part 62 of the insulating layer 60. In the illustrated example, the second electrode 72 is disposed on the insulating layer 60, and the second semiconductor layer 36 and the light propagation layer 40 both exposed by the opening part 62. The planar shape of the second electrode 72 is a circle in the illustrated example. It is also possible for the second semiconductor layer 36 to have ohmic contact with the second electrode 72. The second electrode 72 is electrically coupled to the second semiconductor layer 36. The second electrode 72 is the other of the electrodes for injecting the electrical current into the light emitting layer 34. As the second electrode 72, there is used a transparent electrode made of, for example, ITO (indium tin oxide). As the second electrode 72, there can be used a metal thin film formed so thin that the light can be transmitted. The light emitting device 100 can be provided with an interconnection layer electrically coupled to the second electrode 72, and it is possible for the second electrode 72 to be supplied with the electrical current through the interconnection layer.

It should be noted that although not shown in the drawings, a contact layer can also be disposed between the second semiconductor layer 36 and the second electrode 72. It is also possible for the contact layer to have ohmic contact with the second electrode 72. The contact layer is, for example, a p-type GaN layer.

The second electrode 72 and the insulating layer 60 constitute a covering part 2 for covering the laminated structure 20. In the illustrated example, the covering part 2 covers the columnar parts 30, the light propagation layer 40, the sidewall 50, and the buffer layer 22. The insulating layer 60 covers the buffer layer 22, the sidewall 50, and the columnar parts 30 and the light propagation layer 40 both not overlapping the opening part 62 in the plan view. The second electrode 72 covers the columnar parts 30 and the light propagation layer 40 both overlapping the opening part 62 in the plan view. As described above, the laminated structure 20 and the sidewall 50 are covered with the second electrode 72 and the insulating layer 60. In the illustrated example, the columnar parts 30, the light propagation layer 40, and the sidewall 50 are housed in a space formed by the covering part 2.

The covering part 2 is provided with through holes 4 penetrating the covering part 2. The through holes 4 communicate the space formed by the covering part 2 and the outside with each other. In the illustrated example, the space formed by the covering part 2 is not communicated with the outside except the through holes 4. In the light emitting device 100, the through holes 4 are provided to the second electrode 72. The second electrode 72 is provided with the plurality of through holes 4. In the example shown in FIG. 2, the second electrode 72 is provided with the four through holes 4. It should be noted that the number and the positions of the through holes 4 are not particularly limited.

For example, the through holes 4 are not arranged at regular intervals. Thus, it is possible to reduce the possibility that the diffraction or the effect of the photonic crystal develops due to the through holes 4. Further, for example, the pitch of the through holes 4 is longer than the wavelength of the light generated in the light emitting layer 34. Thus, it is possible to reduce the possibility that the diffraction or the effect of the photonic crystal develops due to the through holes 4. For example, when the through holes 4 are arranged at regular intervals with a pitch shorter than the wavelength of the light generated in the light emitting layer 34, there is a possibility that the diffraction or the effect of the photonic crystal develops due to the through holes 4.

A part of each of the through holes 4 does not overlap the columnar part 30 in the plan view. In other words, the through hole 4 has a part not overlapping the columnar part 30 and a part overlapping the columnar part 30 in the plan view. In the illustrated example, the through hole 4 overlaps the columnar part 30 and the light propagation layer 40 in the plan view. A part of the columnar part 30 and a part of the light propagation layer 40 are exposed by the through hole 4.

It should be noted that although not shown in the drawings, all of the through holes 4 are not necessarily required to overlap the columnar part 30 in the plan view. In other words, it is possible for the through hole 4 not to have a part overlapping the columnar part 30, but to overlap only the light propagation layer 40.

The cross-sectional shape of the through hole 4 is, for example, a circle. The cross-sectional shape of the through hole 4 is not limited to a circle, but can also be a polygonal shape, an ellipse, or the like. The diametrical size of the through hole 4 is smaller than the diametrical size of the columnar part 30. The diametrical size of the columnar part 30 is, for example, about several hundreds of nanometers, and the diametrical size of the through hole 4 is, for example, no larger than 100 nm.

It should be noted that when the cross-sectional shape of the through hole 4 is a circle, the "diametrical size of the through hole" denotes the diameter of the circle, and when the cross-sectional shape of the through hole 4 is not a circular shape, the "diametrical size of the through hole" denotes the diameter of the minimum enclosing circle. For example, when the cross-sectional shape of the through hole 4 is a polygonal shape, the diametrical size of the through hole 4 is the diameter of the minimum circle including the polygonal shape inside, and when the cross-sectional shape of the through hole 4 is an ellipse, the diametrical size of the through hole 4 is the diameter of the minimum circle including the ellipse inside.

When the planar shape of the through hole 4 is a circle, the "center of the through hole" denotes the center of the circle, and when the planar shape of the through hole 4 is not a circular shape, the "center of the through hole" denotes the center of the minimum enclosing circle. For example, when the planar shape of the through hole 4 is a polygonal shape, the center of the through hole 4 is the center of the minimum circle including the polygonal shape inside, and when the planar shape of the through hole 4 is an ellipse, the center of the through hole 4 is the center of the minimum circle including the ellipse inside. Further, the pitch of the through holes 4 is a distance between the centers of the through holes 4 adjacent to each other.

In the light emitting device 100, a pin diode is constituted by the p-type second semiconductor layer 36, the light emitting layer 34, and the n-type first semiconductor layer 32. In the light emitting device 100, when applying a forward bias voltage of the pin diode between the first electrode 70 and the second electrode 72, the electrical current is injected into the light emitting layer 34, and recombination of electrons and holes occurs in the light emitting layer 34. The recombination causes light emission. The light generated in the light emitting layer 34 propagates in a direction perpendicular to the stacking direction through the light propagation layer 40 due to the first semiconductor layer 32 and the second semiconductor layer 36 to form a standing wave due to the effect of the photonic crystal caused by the plurality of columnar parts 30, and then causes laser oscillation with a gain in the light emitting layer 34. Then, the light emitting device 100 emits positive first-order diffracted light and negative first-order diffracted light as a laser beam in the stacking direction.

It should be noted that although there is described above when the light emitting device 100 is a light emitting device in which a single columnar part aggregate formed of the plurality of columnar parts 30 is disposed on the substrate 10, the light emitting device 100 can also be a light emitting device in which the columnar part aggregate is used as a single pixel, and the plurality of columnar part aggregates are arranged on the substrate 10 as an array to form a plurality of pixels.

Further, although not shown in the drawings, it is also possible to dispose a reflecting layer between the substrate 10 and the buffer layer 22, or below the substrate 10. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 72 side.

The light emitting device 100 has, for example, the following advantages.

The light emitting device 100 has the covering part 2 for covering the laminated structure 20, and the covering part 2 is provided with the through holes 4 penetrating the covering part 2. Therefore, in the light emitting device 100, it is possible to discharge the gas used in the manufacturing process and remaining between the columnar parts 30, the gas generated from the material constituting the light emitting device 100, and so on from the through holes 4. Therefore, in the light emitting device 100, it is possible to prevent, for example, the gas used in the manufacturing process and remaining between the columnar parts 30 and the gas generated from the material constituting the light emitting device 100 from expanding due to the heat in the manufacturing process or the heat when the light emitting device 100 operates to cause the electrode to be separated. Further, for example, it is possible to reduce the deterioration of the element characteristics due to the contamination of the surfaces of the columnar parts 30 with the gas. As described above, in the light emitting device 100, it is possible to achieve the prevention of the breakage of the elements and the reduction of the deterioration of the element characteristics.

In the light emitting device 100, the covering part 2 has the second electrode 72, and the through holes 4 are provided to the second electrode 72. Therefore, in the light emitting device 100, it is possible to efficiently discharge the gas remaining between the columnar parts 30.

In the light emitting device 100, the diametrical size of the through hole 4 is smaller than the diametrical size of the columnar part 30 in the plan view. Therefore, in the light emitting device 100, the through holes 4 do not hinder the electrical coupling between the second electrode 72 and the columnar parts 30. For example, when the diametrical size of the through hole 4 is no smaller than the diametrical size of the columnar part 30, the second electrode 72 and the columnar part 30 fail to electrically be coupled to each other in some cases depending on the position of the through hole 4. In contrast, when the diametrical size of the through hole 4 is smaller than the diametrical size of the columnar part 30, it is possible to surely couple the second electrode 72 and the columnar part 30 electrically to each other irrespective of the position of the through hole 4.

In the light emitting device 100, at least a part of the through hole 4 fails to overlap the columnar part 30 in the plan view. Therefore, in the light emitting device 100, it is possible to efficiently discharge the gas remaining between the columnar parts 30.

1.2. Method of Manufacturing Light Emitting Device

Figure 3:
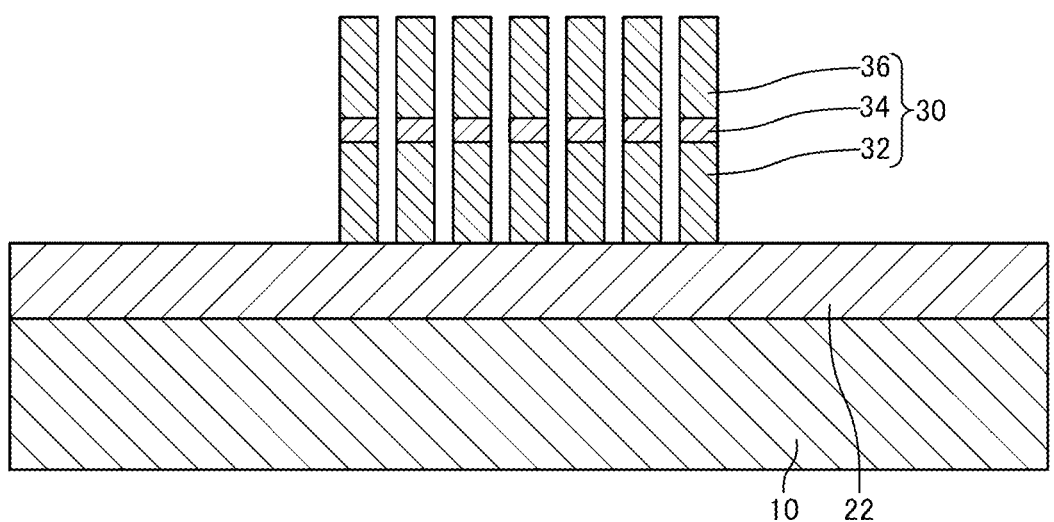
FIG. 3 is a cross-sectional view schematically showing a manufacturing process of the light emitting device according to the first embodiment.
Figure 4:
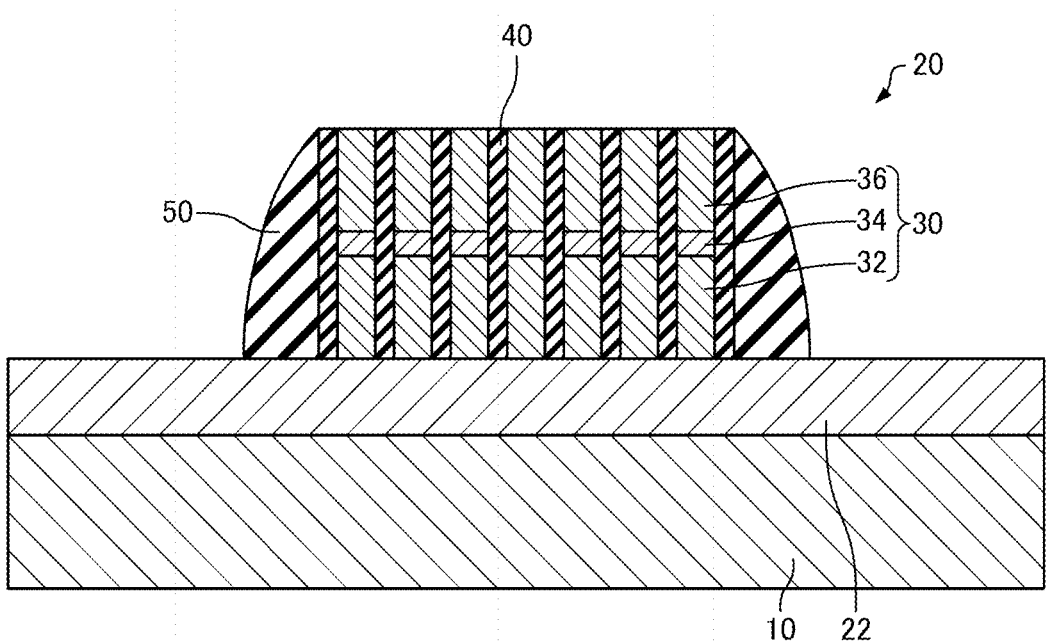
FIG. 4 is a cross-sectional view schematically showing the manufacturing process of the light emitting device according to the first embodiment.

Then, a method of manufacturing the light emitting device 100 will be described with reference to the drawings. FIG. 3 and FIG. 4 are cross-sectional views schematically showing the manufacturing process of the light emitting device 100.

As shown in FIG. 3, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, the plurality of columnar parts 30 is formed on the buffer layer 22. For example, firstly, a mask layer not shown is formed on the buffer layer 22, then the first semiconductor layer 32, the light emitting layer 34, and the second semiconductor layer 36 are grown epitaxially on the buffer layer 22 using the mask layer as a mask. As the method of achieving the epitaxial growth, there can be cited, for example, the MOCVD method and the MBE method. Due to the present process, it is possible to form the columnar parts 30.

As shown in FIG. 4, the light propagation layer 40 is formed between the columnar parts 30 adjacent to each other. The light propagation layer 40 is formed using, for example, the MOCVD method or a spin-coating method. Due to the process described hereinabove, the laminated structure 20 can be formed. Then, the sidewall 50 is formed on the side wall of the light propagation layer 40. The sidewall 50 can be formed by, for example, depositing a silicon oxide layer on the entire surface, and then performing an etch back.

As shown in FIG. 1, the insulating layer 60 covering the laminated structure 20 is formed. The insulating layer 60 is formed by deposition using, for example, a spin-coating method or a CVD method, and patterning. Then, the first electrode 70 is formed on the buffer layer 22, and the second electrode 72 having the through holes 4 is formed on the laminated structure 20. The first electrode 70 and the second electrode 72 are formed by deposition using, for example, a sputtering method or a vacuum deposition method, and patterning. Due to the above process, the covering part 2 is formed.

Due to the process described hereinabove, it is possible to manufacture the light emitting device 100.

Here, in the process of forming the light propagation layer 40 described above, the light propagation layer 40 cannot completely embedded between the columnar parts 30, but a void is formed, and the gas remains in some cases. In the light emitting device 100, since the through holes 4 are provided to the second electrode 72, it is possible to discharge the gas remaining between the columnar parts 30 from the through holes 4. Therefore, it is possible to prevent the gas remaining from expanding due to, for example, the heat in the manufacturing process or the heat when the light emitting device 100 operates to cause the second electrode 72 to be separated.

2. Second Embodiment

Figure 5:
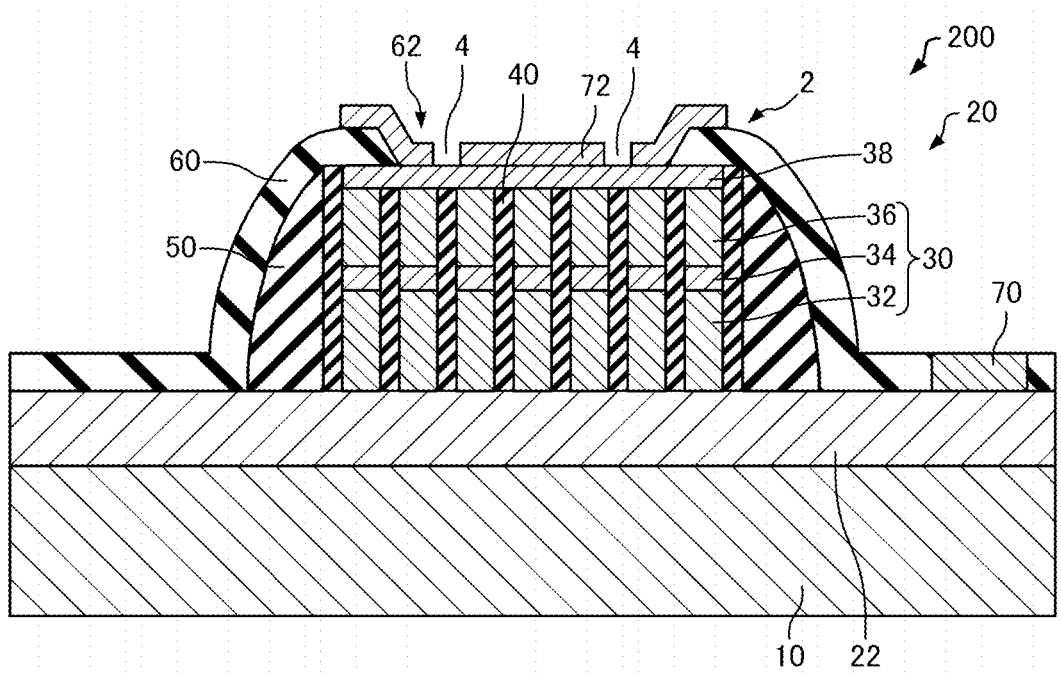
FIG. 5 is a cross-sectional view schematically showing a light emitting device according to a second embodiment.

Then, a light emitting device according to a second embodiment will be described with reference to the drawings. FIG. 5 is a cross-sectional view schematically showing the light emitting device 200 according to the second embodiment. Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

As shown in FIG. 5, in the light emitting device 200, the laminated structure 20 includes a third semiconductor layer 38 between the second semiconductor layer 36 and the second electrode 72. The third semiconductor layer 38 is a contact layer, and has ohmic contact with the second electrode 72. The third semiconductor layer 38 is, for example, a p-type GaN layer.

The third semiconductor layer 38 is disposed on the plurality of columnar parts 30 and the light propagation layer 40. The third semiconductor layer 38 is disposed straddling the plurality of columnar parts 30. The third semiconductor layer 38 is a single layer continuously disposed on the plurality of columnar parts 30 and the light propagation layer 40.

The second electrode 72 is disposed on the third semiconductor layer 38. The second electrode 72 is provided with the through holes 4. The through holes 4 overlap the third semiconductor layer 38 in the plan view. A part of the third semiconductor layer 38 is exposed by the through holes 4.

In the light emitting device 200, the third semiconductor layer 38 is provided between the second semiconductor layer 36 and the second electrode 72, and the second electrode 72 is provided with the through holes 4. Therefore, in the light emitting device 200, it is possible to discharge the gas remaining between the third semiconductor layer 38 and the second electrode 72 in the manufacturing process, the gas generated from the residue between the third semiconductor layer 38 and the second electrode 72, and so on from the through holes 4. Therefore, in the light emitting device 200, it is possible to achieve the prevention of the breakage of the elements and the reduction of the deterioration of the element characteristics similarly to the light emitting device 100.

A method of manufacturing the light emitting device 200 is substantially the same as the method of manufacturing the light emitting device 100 except the point that the third semiconductor layer 38 is formed between the second semiconductor layer 36 and the second electrode 72, and the description thereof will be omitted.

3. Third Embodiment

Figure 6:
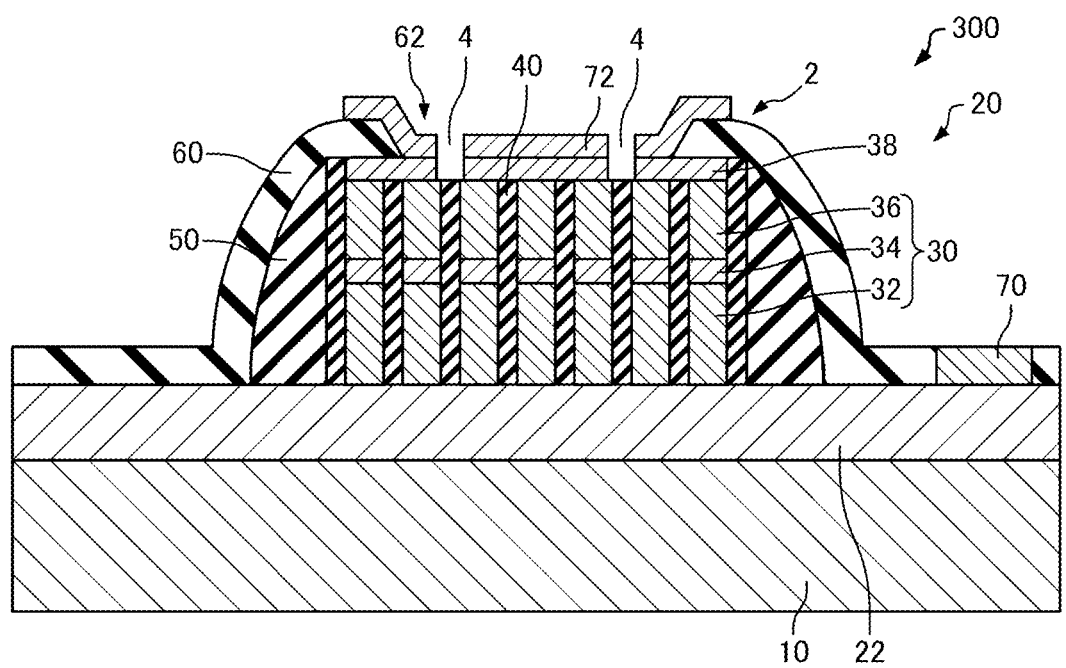
FIG. 6 is a cross-sectional view schematically showing a light emitting device according to a third embodiment.

Then, a light emitting device according to a third embodiment will be described with reference to the drawings. FIG. 6 is a cross-sectional view schematically showing a light emitting device 300 according to the third embodiment. Hereinafter, in the light emitting device 300 according to the third embodiment, the members having substantially the same functions as those of the constituent members of the light emitting device 100 according to the first embodiment and the light emitting device 200 according to the second embodiment described above will be denoted by the same reference symbols, and the detailed description thereof will be omitted.

As shown in FIG. 6, in the light emitting device 300, the laminated structure 20 has the third semiconductor layer 38, and the through holes 4 penetrate the second electrode 72 and the third semiconductor layer 38. Therefore, it is possible to discharge the gas used in the manufacturing process and remaining between the columnar parts 30, the gas generated from the material constituting the light emitting device 300, and so on from the through holes 4. Therefore, in the light emitting device 300, it is possible to achieve the prevention of the breakage of the elements and the reduction of the deterioration of the element characteristics similarly to the light emitting device 100.

A method of manufacturing the light emitting device 300 is substantially the same as the method of manufacturing the light emitting device 100 except the point that the third semiconductor layer 38 is formed between the second semiconductor layer 36 and the second electrode 72, and the through holes 4 penetrating the second electrode 72 and the third semiconductor layer 38 are formed, and the description thereof will be omitted.

4. Fourth Embodiment

Figure 7:
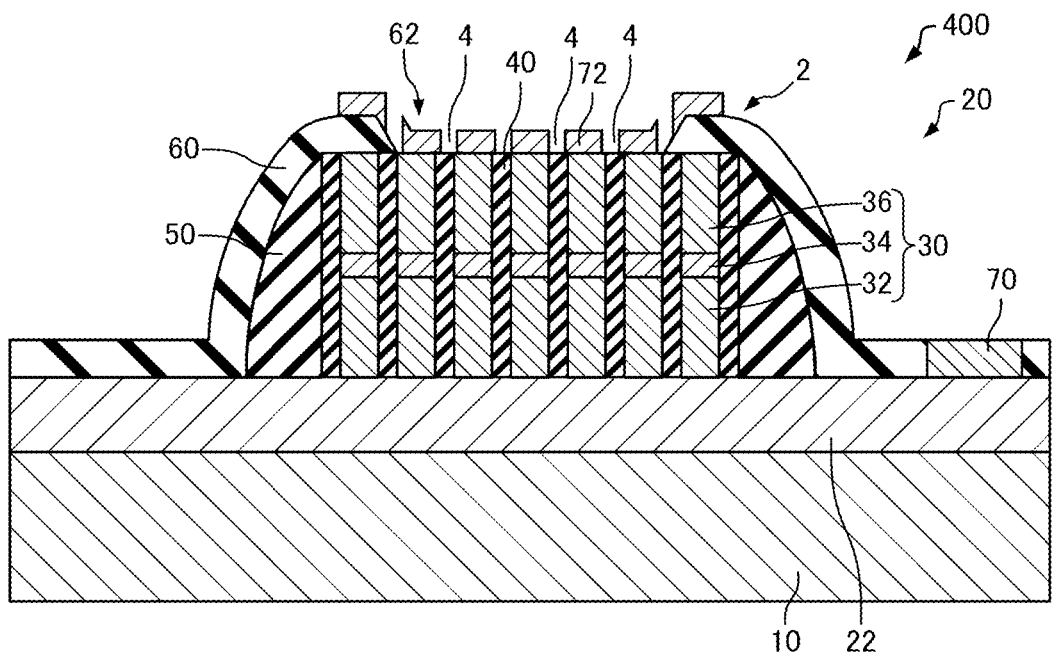
FIG. 7 is a cross-sectional view schematically showing a light emitting device according to a fourth embodiment.
Figure 8:
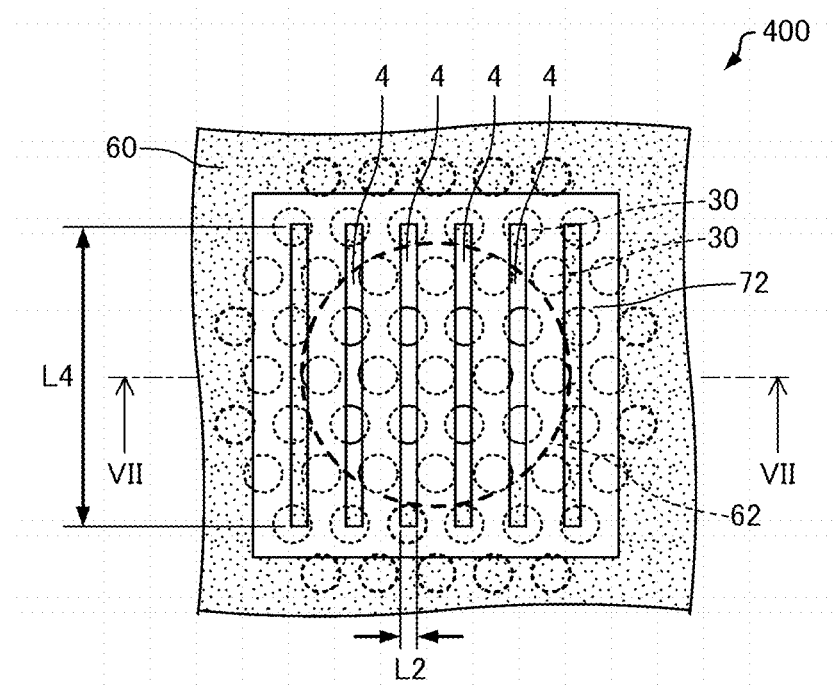
FIG. 8 is a plan view schematically showing the light emitting device according to the fourth embodiment.

Then, a light emitting device according to a fourth embodiment will be described with reference to the drawings. FIG. 7 is a cross-sectional view schematically showing a light emitting device 400 according to the fourth embodiment. FIG. 8 is a plan view schematically showing the light emitting device 400 according to the fourth embodiment. It should be noted that FIG. 7 is a cross-sectional view along the line VII-VII shown in FIG. 8. Hereinafter, in the light emitting device 400 according to the fourth embodiment, the members having substantially the same functions as those of the constituent members of the light emitting device 100 according to the first embodiment described above will be denoted by the same reference symbols, and the detailed description thereof will be omitted.

As shown in FIG. 7 and FIG. 8, in the light emitting device 400, the through holes 4 are each disposed so as to have a slit-like shape.

As shown in FIG. 8, the through holes 4 each have a longitudinal direction and a short-side direction in the plan view. In the example shown in FIG. 8, the planar shape of each of the through holes 4 is a rectangular shape. It should be noted that the planar shape of each of the through holes 4 is not particularly limited as long as the shape has a longitudinal direction and a short-side direction, and can also be, for example, an ellipse.

The length L2 in the short-side direction of the through hole 4 is shorter than the diametrical size of the columnar part 30. Therefore, the through holes 4 do not hinder the electrical coupling between the second electrode 72 and the columnar parts 30. For example, when the length L2 of the through hole 4 is no shorter than the diametrical size of the columnar part 30, the second electrode 72 and the columnar part 30 fail to electrically be coupled to each other in some cases depending on the position of the through hole 4. In contrast, when the length L2 of the through hole 4 is shorter than the diametrical size of the columnar part 30, it is possible to surely couple the second electrode 72 and the columnar part 30 electrically to each other irrespective of the position of the through hole 4. The length in the short-side direction of the through hole 4 is the maximum length in the short-side direction of the through hole 4.

The length L4 in the longitudinal direction of the through hole 4 is longer than the diametrical size of the columnar part 30. Therefore, there is no chance for the through hole 4 to be blocked by the columnar part 30. For example, when the length L4 of the through hole 4 is equal to or shorter than the diametrical size of the columnar part 30, the through hole 4 is blocked by the columnar part 30 in some cases depending on the position of the through hole 4. In contrast, when the length L4 of the through hole 4 is longer than the diametrical size of the columnar part 30, there is no chance for the through hole 4 to be blocked by the columnar part 30 irrespective of the position of the through hole 4. Therefore, it is possible to discharge the gas remaining between the columnar parts 30 from the through holes 4. In the example shown in FIG. 8, the length L4 of the through hole 4 is longer than the width of the opening part 62 of the insulating layer 60. The length in the longitudinal direction of the through hole 4 is the maximum length in the longitudinal direction of the through hole 4.

A method of manufacturing the light emitting device 400 is substantially the same as the method of manufacturing the light emitting device 100 except the point that the through holes 4 are each formed to have a slit-like shape in the process of forming the second electrode 72, and therefore, the description thereof will be omitted.

5. Fifth Embodiment

Figure 9:
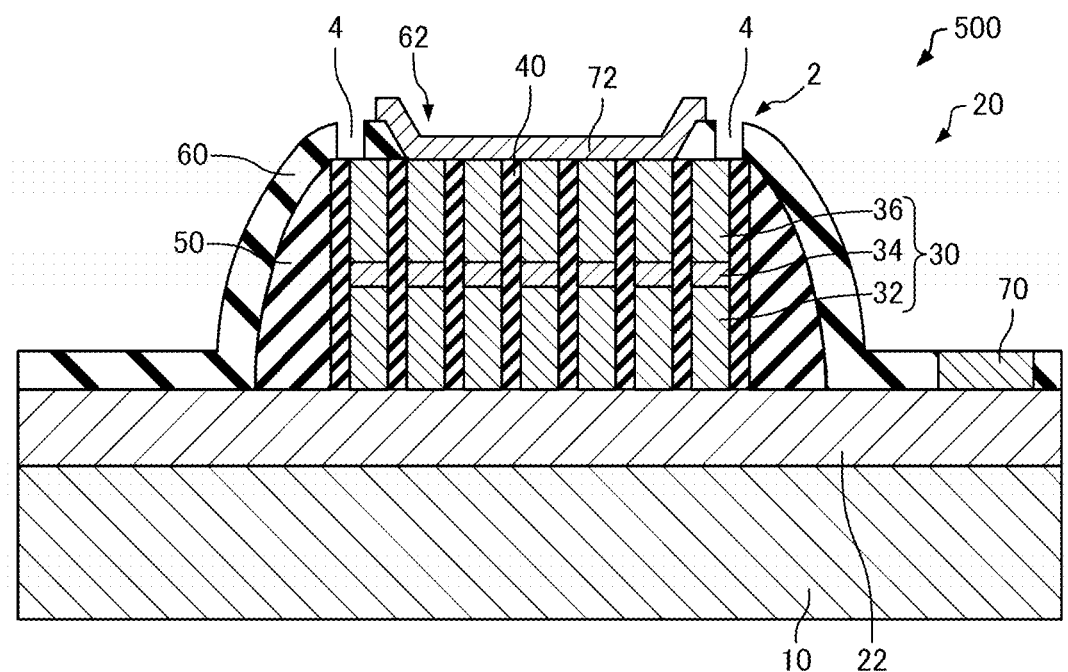
FIG. 9 is a cross-sectional view schematically showing a light emitting device according to a fifth embodiment.
Figure 10:
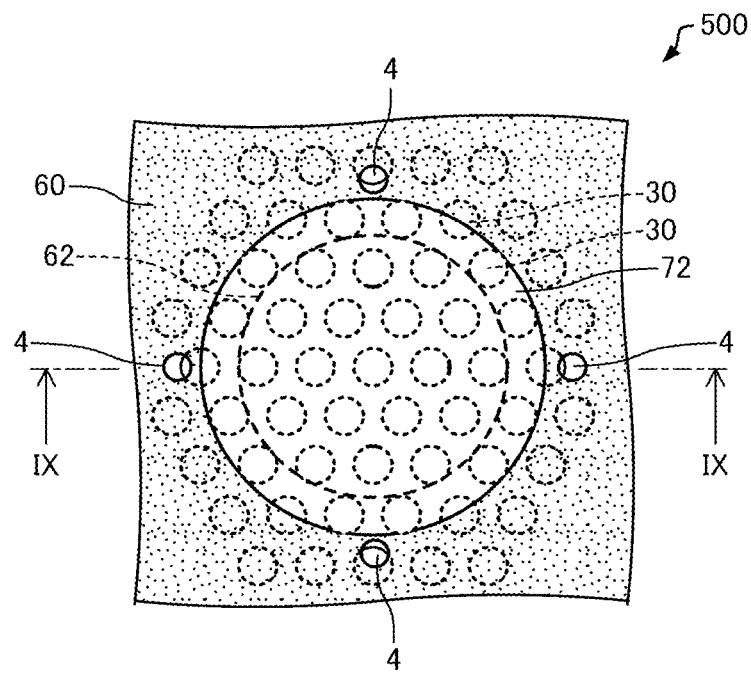
FIG. 10 is a plan view schematically showing the light emitting device according to the fifth embodiment.

Then, a light emitting device according to a fifth embodiment will be described with reference to the drawings. FIG. 9 is a cross-sectional view schematically showing a light emitting device 500 according to the fifth embodiment. FIG. 10 is a plan view schematically showing the light emitting device 500 according to the fifth embodiment. It should be noted that FIG. 9 is a cross-sectional view along the line IX-IX shown in FIG. 10. Hereinafter, in the light emitting device 500 according to the fifth embodiment, the members having substantially the same functions as those of the constituent members of the light emitting device 100 according to the first embodiment described above will be denoted by the same reference symbols, and the detailed description thereof will be omitted.

As shown in FIG. 9 and FIG. 10, in the light emitting device 500, the through holes 4 are provided to the insulating layer 60.

The through holes 4 penetrate the insulating layer 60. The through holes 4 are disposed at positions overlapping the light propagation layer 40 in the plan view. The through holes 4 are disposed outside the outer edge of the second electrode 72 in the plan view. In other words, the through holes 4 do not overlap the second electrode 72 in the plan view. Therefore, the through holes 4 are not blocked by the second electrode 72.

The diametrical size of the through hole 4 is smaller than, for example, the diametrical size of the columnar part 30. Thus, it is possible to decrease the possibility that, for example, the insulating layer 60 is separated.

In the light emitting device 500, the through holes 4 are provided to the insulating layer 60. Therefore, in the light emitting device 500, it is possible to discharge the gas used in the manufacturing process and remaining between the columnar parts 30, the gas generated from the material constituting the light emitting device 500, and so on from the through holes 4. Therefore, in the light emitting device 500, it is possible to achieve the prevention of the breakage of the elements and the reduction of the deterioration of the element characteristics similarly to the light emitting device 100.

A method of manufacturing the light emitting device 500 is substantially the same as the method of manufacturing the light emitting device 100 except the point that the through holes 4 are provided to the insulating layer 60, and therefore, the description thereof will be omitted.

It should be noted that although not shown in the drawings, the through holes 4 can be provided to both of the insulating layer 60 and the second electrode 72.

Figure 11:
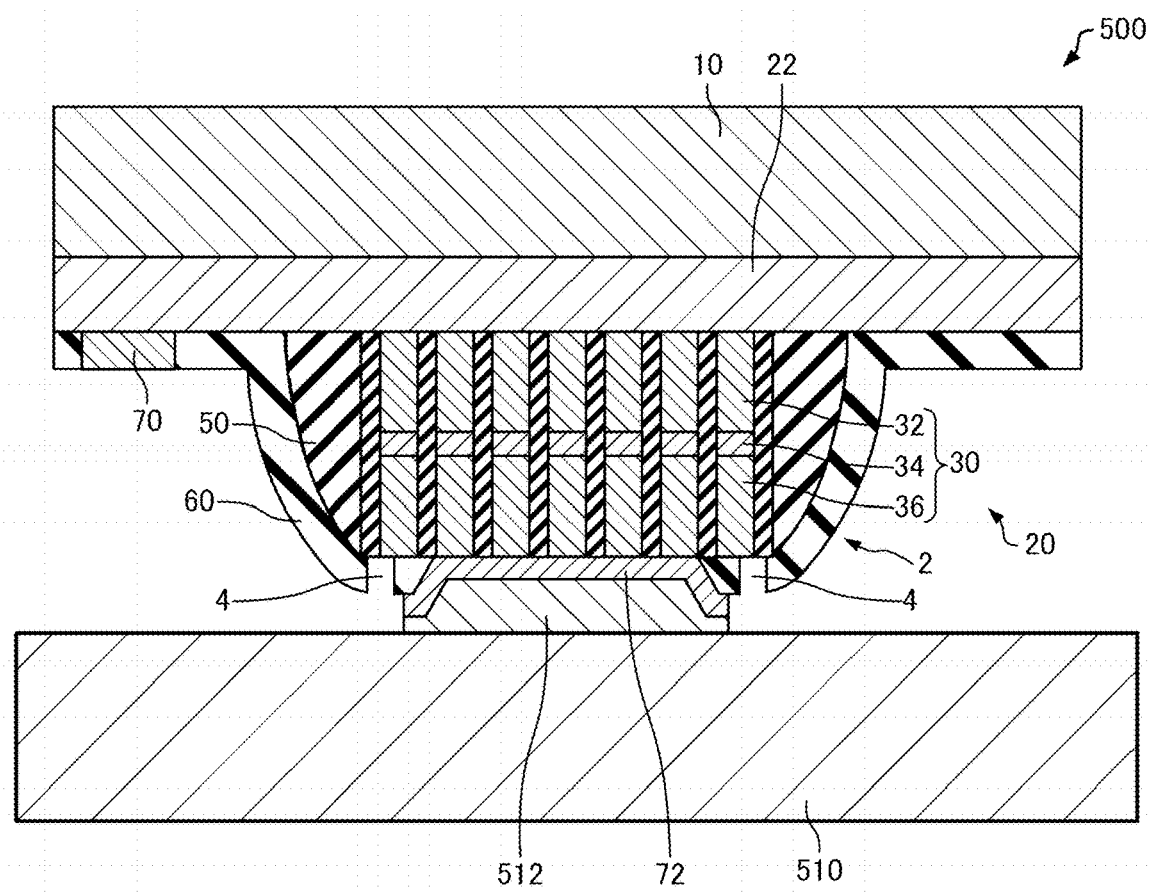
FIG. 11 is a cross-sectional view schematically showing a state in which the light emitting device according to the fifth embodiment is mounted on a mounting substrate using junction-down mounting.

FIG. 11 is a cross-sectional view schematically showing a state in which the light emitting device 500 is mounted on a mounting substrate 510 using junction-down mounting.

As shown in FIG. 11, the light emitting device 500 is mounted on the mounting substrate 510 using the junction-down mounting. In other words, in the light emitting device 500, the second electrode 72 is coupled to the mounting substrate 510. In the light emitting device 500, since the through holes 4 are provided to the insulating layer 60, even when mounting the light emitting device 500 on the mounting substrate 510 using the junction-down mounting, the through holes 4 are not blocked.

When the light emitting device 500 is mounted using the junction-down mounting, a substrate transparent to the wavelength of the light generated in the light emitting layer 34 is used as the substrate 10. As the substrate 10, there can be used, for example, a sapphire substrate or a glass substrate. Further, the second electrode 72 reflects the light generated in the light emitting layer 34. As the second electrode 72, there can be used a metal layer such as an Au layer or an Ag layer, or what is obtained by stacking the metal layers. Thus, in the light emitting device 500, it is possible to emit the light from the substrate 10 side.

The light emitting device 500 and the mounting substrate 510 are bonded to each other with, for example, a bonding member 512. The bonding member 512 is Au-series solder such as AuSn.

6. Sixth Embodiment

Figure 12:
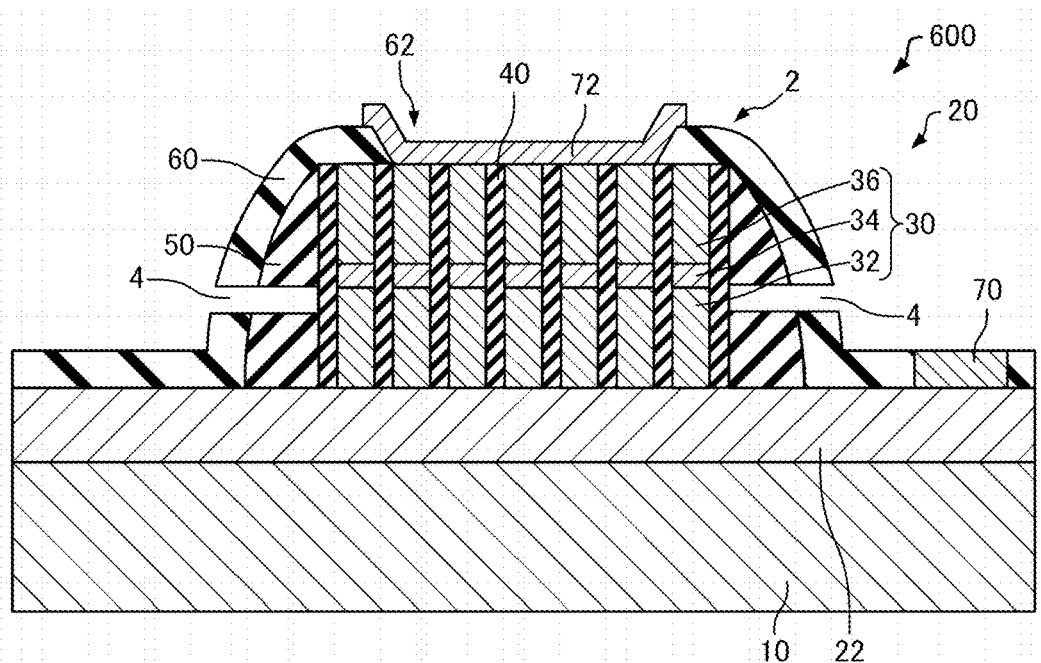
FIG. 12 is a cross-sectional view schematically showing a light emitting device according to a sixth embodiment.
Figure 13:
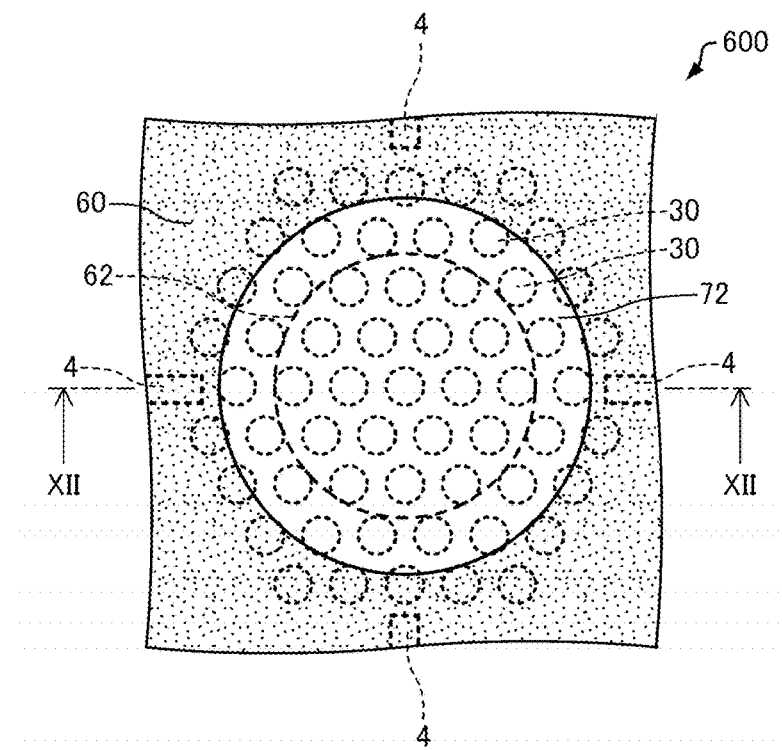
FIG. 13 is a plan view schematically showing the light emitting device according to the sixth embodiment.

Then, a light emitting device according to a sixth embodiment will be described with reference to the drawings. FIG. 12 is a cross-sectional view schematically showing a light emitting device 600 according to the sixth embodiment. FIG. 13 is a plan view schematically showing the light emitting device 600 according to the sixth embodiment. It should be noted that FIG. 12 is a cross-sectional view along the line XII-XII shown in FIG. 13.

Hereinafter, in the light emitting device 600 according to the sixth embodiment, the members having substantially the same functions as those of the constituent members of the light emitting device 100 according to the first embodiment and the light emitting device 500 according to the fifth embodiment described above will be denoted by the same reference symbols, and the detailed description thereof will be omitted.

As shown in FIG. 12 and FIG. 13, in the light emitting device 600, the through holes 4 are penetrate the insulating layer 60 in a direction crossing the stacking direction. In the illustrated example, the through holes 4 penetrate the insulating layer 60 in a direction perpendicular to the stacking direction. The through holes 4 penetrate the insulating layer 60 and the sidewall 50. It should be noted that it is possible for the through holes 4 to penetrate only the insulating layer 60. The opening of the through hole 4 is disposed on the side surface of the insulating layer 60. The through holes 4 penetrate the insulating layer 60 disposed on the sidewall 50.

The through holes 4 can be formed by, for example, forming a sacrifice layer at parts to be the through holes 4 in the process of forming the insulating layer 60 and then selectively etching the sacrifice layer.

In the light emitting device 600, the through holes 4 are provided to the insulating layer 60. Therefore, in the light emitting device 600, it is possible to discharge the gas used in the manufacturing process and remaining between the columnar parts 30, the gas generated from the material constituting the light emitting device 600, and so on from the through holes 4. Therefore, in the light emitting device 600, it is possible to achieve the prevention of the breakage of the elements and the reduction of the deterioration of the element characteristics similarly to the light emitting device 100.

It should be noted that although not shown in the drawings, the light emitting device 600 can be mounted on the mounting substrate 510 using the junction-down mounting similarly to the light emitting device 500 shown in FIG. 11 described above. In the light emitting device 600, since the through holes 4 are provided to the insulating layer 60 similarly to the light emitting device 500, even when mounting the light emitting device 600 on the mounting substrate 510 using the junction-down mounting, the through holes 4 are not blocked.

7. Seventh Embodiment

Figure 14:
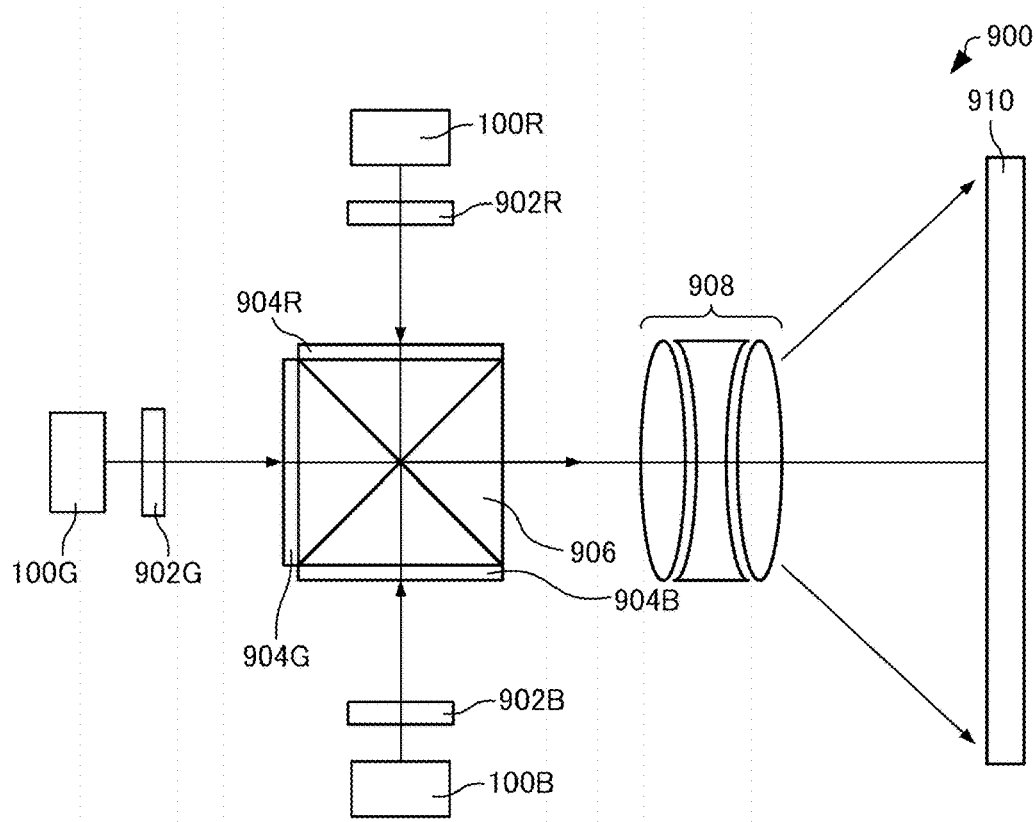
FIG. 14 is a diagram schematically showing a projector according to a seventh embodiment.

Then, a projector according to a seventh embodiment will be described with reference to the drawings. FIG. 14 is a diagram schematically showing a projector 900 according to the seventh embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 14, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

8. Other Issues

It should be noted that the present disclosure is not limited to the embodiments described above, but can be put into practice with a variety of modifications within the scope or the spirit of the present disclosure.

For example, although there is described the light emitting layer 34 of the InGaN type in the light emitting device 100 according to the first embodiment described above, as the light emitting layer 34, it is possible to use any types of material capable of emitting light in response to an electrical current injected in accordance with the wavelength of the light to be emitted. It is possible to use semiconductor materials such as an AlGaN type, an AlGaAs type, an InGaAs type, an InGaAsP type, an InP type, a GaP type, or an AlGaP type. The same applies to the light emitting devices according to the second through sixth embodiments, and as the light emitting layer 34, it is possible to use a variety of material types in accordance with the wavelength of the light emitted.

Further, although in the first embodiment, there is described when the light emitting device 100 is the semiconductor laser using the columnar parts 30, the light emitting device 100 can be a super luminescent diode using the columnar parts 30, or can also be a light emitting diode using the columnar parts 30. The same applies to the light emitting devices according to the second through sixth embodiments.

In the present disclosure, some of the constituents can be omitted, or any of the embodiments can be combined with each other, within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration means a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as the configuration explained in the description of the embodiments. Further, the present disclosure includes configurations obtained by adding a known technology to the configuration explained in the description of the embodiments.

What is claimed is:

1. A light emitting device comprising:
a substrate;
a laminated structure provided to the substrate, the laminated structure including a plurality of columnar parts; and
a covering member covering the laminated structure, wherein
each of the columnar parts has a light emitting layer,
the covering member has a through hole therein,
the covering member covers an entirety of an outer surface of the laminated structure except for the through hole, and part of the outer surface of the laminated structure is exposed to an outside of the covering member via the through hole,
the through hole is closed-circular shaped, and
a diametrical size of the through hole is smaller than a diametrical size of each of the columnar parts.

2. The light emitting device according to claim 1, wherein
the covering member includes an electrode electrically coupled to the columnar parts,
the electrode is disposed at an opposite side to the substrate of the laminated structure, and the electrode has the through hole.

3. The light emitting device according to claim 2, wherein
at least a part of the through hole fails to overlap the columnar parts in a plan view viewed from a stacking direction of the laminated structure.

4. The light emitting device according to claim 1, wherein
the covering member includes an insulating layer and an electrode, the electrode being electrically coupled to the columnar parts,
the electrode is disposed at an opposite side to the substrate of the laminated structure, and
the insulating layer has the through hole.

5. The light emitting device according to claim 4, wherein
the insulating layer has an opening part,
the electrode is disposed in the opening part, and
the through hole is disposed outside an outer edge of the electrode in a plan view viewed from a stacking direction of the laminated structure.

6. The light emitting device according to claim 4, wherein the through hole penetrates the insulating layer in a direction crossing a stacking direction of the laminated structure.

7. A projector comprising:
the light emitting device according to claim 1.

8. A light emitting device comprising:
a substrate;
a laminated structure provided to the substrate, the laminated structure including a plurality of columnar parts; and
a covering member covering the laminated structure, wherein
each of the columnar parts has a light emitting layer,
the covering member has a through hole therein, the covering member covers over an outer surface of the laminated structure except for the through hole,
the laminated structure is housed in a space formed by the covering member,
the through hole is closed-circular shaped, and
a diametrical size of the through hole is smaller than a diametrical size of each of the columnar parts.

* * * * *